(12) United States Patent
Lee (10) Patent No.: US 7,399,570 B2
(45) Date of Patent: Jul. 15, 2008

(54) WATER-SOLUBLE NEGATIVE PHOTORESIST POLYMER AND COMPOSITION CONTAINING THE SAME

(75) Inventor: Geun Su Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 253 days.

(21) Appl. No.: 10/999,416

(22) Filed: Mar. 31, 2005

(65) Prior Publication Data

US 2005/0282080 A1      Dec. 22, 2005

(30) Foreign Application Priority Data

Jun. 18, 2004   (KR) .................. 10-2004-0045552
Jun. 18, 2004   (KR) .................. 10-2004-0045554

(51) Int. Cl.
  *G03F 7/00*    (2006.01)
  *G03F 7/004*   (2006.01)
  *G08F 118/02*  (2006.01)

(52) U.S. Cl. ............... 430/270.1; 430/311; 430/330; 526/72; 526/319; 526/320

(58) Field of Classification Search ............... None
   See application file for complete search history.

(56) References Cited

U.S. PATENT DOCUMENTS

| 5,272,026 A   | 12/1993 | Roland et al. |
| 5,548,047 A * | 8/1996  | Ito et al. ............... 526/240 |
| 6,399,273 B1  | 6/2002  | Yamada et al. |

FOREIGN PATENT DOCUMENTS

| JP | 56004152      | 1/1981 |
| JP | 2000098630    | 4/2000 |
| KR | 10-1998-015678 | 5/1998 |

* cited by examiner

*Primary Examiner*—Amanda Walke
(74) *Attorney, Agent, or Firm*—Marshall, Gerstein & Borun LLP (57) ABSTRACT

Photoresist patterns are formed using a photoresist composition, which includes water, a negative photoresist polymer having a salt-type repeating unit, and a photoacid generator, so that a developing process can be performed not by using conventional TMAH solution but by using water. Additionally, because the main solvent of the composition is water, the disclosed photoresist composition is environment-friendly, and has a low light absorbance at 193 nm and 248 nm, which is useful in a photolithography process using a light source in a far ultraviolet region when high-integrated fine circuits of semiconductor device are manufactured.

32 Claims, 8 Drawing Sheets

WATER-SOLUBLE NEGATIVE PHOTORESIST POLYMER AND COMPOSITION CONTAINING THE SAME

BACKGROUND OF THE DISCLOSURE

1. Field of the Invention

The disclosure relates to a water-soluble, negative photoresist polymer including a salt-type repeating unit and a photoresist composition containing the same. More specifically, the disclosure relates to a negative photoresist polymer having a salt-type repeating unit, which is used with light sources such as KrF (248 nm), ArF (193 nm), and extreme ultraviolet (EUV) to form photoresist patterns, and a photoresist composition containing the photoresist polymer.

2. Description of the Related Technology

According to a conventional photolithography process for forming a photoresist pattern, a photoresist composition is applied to an underlying layer of a semiconductor substrate, and then baked to form a photoresist film. Next, the photoresist film is exposed to light and developed, and then rinsed to obtain a photoresist pattern.

The photoresist composition used in the conventional photolithography process has been oil soluble. In other words, since the photoresist polymer is oil soluble, an organic solvent, as a main solvent, has been used when a photoresist composition containing the photoresist polymer is fabricated, which results in a serious cause of environmental pollution. In addition, since a tetramethyl ammonium hydroxide (TMAH) aqueous solution or basic aqueous solution is used in the developing process, the photoresist film is required to be additionally cleaned with water in a subsequent process.

SUMMARY OF THE DISCLOSURE

Disclosed herein is a water-soluble, negative photoresist polymer comprising a repeating unit represented by Formula (I):

wherein, $R_1$, $R_2$, $R_3$, $R_4$, $R_5$, and $R_6$ are individually selected from the group consisting of hydrogen, $C_1$-$C_{10}$ alkyl, and $CF_3$; the relative ratio of b:c:d is 0.5 to 99.5 mol. %:0.5 to 95 mol. %:0 to 99 mol %; and, m is an integer ranging from 1 to 10.

Also disclosed herein is a method of preparing the polymer by reacting a basic compound with a polymer having a repeating unit as represented by Formula (IV):

wherein $R_1$ and $R_2$ are individually selected from the group consisting of hydrogen, $C_1$-$C_{10}$ alkyl, and $CF_3$; the relative ratio of a:b is 1 to 99 mol. %:1 to 99 mol. %; and, m is an integer ranging from 1 to 10.

Various photoresist compositions also are disclosed. One embodiment of such a composition includes a basic compound, water, a photoacid generator, and a polymer having the repeating unit represented by Formula (IV).

Another embodiment of a photoresist composition includes a basic compound, water, a photoacid generator, and a polymer having a repeating unit represented by Formula (V):

wherein $R_7$, $R_8$, $R_9$, and $R_{10}$ are individually selected from the group consisting of hydrogen, $C_1$-$C_{10}$ alkyl, and $CF_3$; the relative ratio of e:f:g is 0.5 to 99.9 mol. %:0 to 50 mol. %:0.1 to 30 mol. %; and, n is an integer ranging from 1 to 10.

Also disclosed herein is a method of forming a photoresist pattern includes coating the photoresist composition on an underlying layer of a semiconductor substrate to form a photoresist film; exposing the photoresist film to light; and developing the exposed photoresist film to obtain a photoresist pattern.

Additional features of the invention may become apparent to those skilled in the art from a review of the following detailed description, taken in conjunction with the drawing figures, the examples, and the appended claims.

BRIEF DESCRIPTION OF THE DRAWINGS

For a more complete understanding of the invention, reference should be made to the following detailed description and accompanying drawings wherein.

While the disclosed invention is susceptible of embodiments in various forms, there are illustrated in the drawings (and will hereafter be described) specific embodiments of the invention, with the understanding that the disclosure and

DETAILED DESCRIPTION OF THE PRESENTLY PREFERRED EMBODIMENTS

There is provided a water-soluble, negative photoresist polymer having a repeating unit represented by Formula (I):

(I)

wherein $R_1$, $R_2$, $R_3$, $R_4$, $R_5$, and $R_6$ are individually selected from the group consisting of hydrogen, $C_1$-$C_{10}$ alkyl, and $CF_3$; the relative ratio of b:c:d is 0.5 to 99.5 mol. %:0.5 to 95 mol. %:0 to 99 mol. %; and m is an integer ranging from 1 to 10.

In addition, the water-soluble negative photoresist polymer of the present invention may include the repeating unit represented by Formula (III), which optionally includes a monomer of Formula (II):

(II)

wherein $R_9$ and $R_{10}$ are individually selected from the group consisting of hydrogen, $C_1$-$C_{10}$ alkyl, and $CF_3$.

The repeating unit of Formula (III) is:

(III)

wherein $R_7$, $R_8$, $R_9$, $R_{10}$, $R_{11}$, $R_{12}$, $R_{13}$, $R_{14}$ are individually selected from the group consisting of hydrogen, $C_1$-$C_{10}$ alkyl, and $CF_3$. The relative ratio of f:g:h:i is 0 to 50 mol. %:0.1 to 30 mol. %:1 to 98.9 mol. %:1 to 98.9 mol. %; and n is an integer ranging from 1 to 10.

Herein, each of the repeating units of Formulas (I) and (III) forms a salt type in a branched chain of the parts c and h, so that the polymers containing the above repeating units are water-soluble.

Also, there is provided a method for preparing the above water-soluble negative photoresist polymer. The water-soluble negative photoresist polymer is prepared by reacting a basic compound with a polymer including a repeating unit represented by Formulas (IV) or (V). That is, since the parts a and e in the repeating units of Formulas (IV) and (V) have a carboxylic acid, the water-soluble negative photoresist polymer is reacted with the basic compound to form a salt type that is water-soluble.

The repeating unit of Formula (IV) is:

(IV)

wherein $R_1$ and $R_2$ are individually selected from the group consisting of hydrogen, $C_1$-$C_{10}$ alkyl, and $CF_3$; the relative ratio of a:b is 1 to 99 mol. %:1 to 99 mol. %; and m is an integer ranging from 1 to 10.

The repeating unit of Formula (V) is:

(V)

wherein $R_7$, $R_8$, $R_9$, and $R_{10}$ are individually selected from the group consisting of hydrogen, $C_1$-$C_{10}$ alkyl, and $CF_3$; the relative ratio of e:f:g is 0.5 to 99.9 mol. %:0 to 50 mol. %:0.1 to 30 mol. %; and, n is an integer ranging from 1 to 10.

Preferably, the repeating unit of Formula (IV) is selected from the group consisting of Formulas (IVa) to (IVd):

(IVa)

(IVb)

(IVc)

(IVd)

wherein the relative ratio of a:b is 1 to 99 mol. %:1 to 99 mol. %.

Also, the repeating unit of Formula (V) is preferably selected from the group consisting of Formulas (Va) to (Vb)

(Va)

(Vb)

(Vc)

(Vd)

wherein the relative ratio of e:f:g is 0.5 to 99.9 mol. %:0 to 50 mol. %:0.1 to 30 mol. %.

Preferably, the basic compound is an amine or ammonium hydroxide. Additionally, there is provided a photoresist composition including a polymer having a repeating unit represented by Formulas (IV) or (V), a basic compound, water and a photoacid generator.

Preferably, the disclosed photoresist composition further comprises a $C_1$-$C_{10}$ alcohol to increase the solubility of the polymer and the photoacid generator. Here, the $C_1$-$C_{10}$ alcohol is selected from the group consisting of 2-propanol, butyl alcohol, 2-methyl-2-butanol, 2-pentanol, 3-pentanol, 1-hexanol, 1-heptanol, and mixtures thereof, and is present in an amount ranging from 1 wt. % to 50 wt. %, based on the weight of water present in the composition.

When the alcohol compound is less than 1 wt. %, the solubility of the photoresist composition is decreased to precipitate the photoacid generator. When the alcohol compound is more than 50 wt. %, production cost of the photoresist composition increases. Moreover, such a composition would not be an eco-friendly material.

Preferably, the photoresist polymer including a repeating unit represented by Formulas (IV) or (V) is present in an amount ranging from 2 wt. % to 30 wt. %, based on the weight of water present in the composition. When the polymer is less than 2 wt. %, the coating ability of the photoresist composition is not sufficient. When the polymer is more than 30 wt. %, the photoresist film becomes thicker, and it requires excessive energy in the exposure process.

Preferably, the basic compound is present in an amount ranging from 0.001 wt. % to 0.1 wt. %, based on the weight of water present in the composition. Amount of the basic compound used depends on amount of the carboxylic acid contained in the polymer including the repeating unit represented by Formulas (IV) or (V). When the basic compound less than 0.001 wt. %, the solubility of the polymer is lowered, so that the polymer is not dissolved and the acid generated from the photoacid generator in the exposure process is diffused into an unexposed region, thereby distortion of patterns. When the basic compound is more than 0.1 wt. %, acid generated in the exposure process is neutralized, so that patterns are not formed.

The photoacid generator is one or more compounds selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, and naphthylimido trifluoromethane sulfonate. Preferably, the photoacid generator is present in an amount ranging from 0.5 wt. % to 10 wt. %, based on the photoresist polymer having the repeating unit represented by Formulas (IV) or (V). When the photoacid generator is less than 0.5 wt. %, the exposure energy becomes too high. When the photoacid generator is more than 10 wt. %, absorbance of the photoresist composition increases and the amount of acid generated in the exposed region becomes excessively large, so that the formed patterns are distorted.

In addition, there is provided a method for forming a photoresist pattern.

The method includes (a) coating the disclosed photoresist composition on an underlying layer of a semiconductor substrate to form a photoresist film, (b) exposing the photoresist film to light, and (c) developing the exposed photoresist film to obtain a photoresist pattern.

Preferably, the method may further include a soft baking process before the exposing step or a post baking process after the exposing step, and the baking process is performed at a temperature ranging from 70° C. to 200° C.

The light of the exposure process is selected from the group consisting of $F_2$ (157 nm), ArF (193 nm), KrF (248 nm), E-beam, EUV (13 nm), and ion-beam, and the exposing step is performed at an exposure energy ranging from about 0.1 mJ/cm$^2$ to 100 mJ/cm$^2$.

A reaction mechanism of the disclosed negative photoresist pattern is described through the following Schemes 1 and 2.

The polymer including the repeating unit of Formulas (IV) or (V) having a carboxyl group in the parts a and e is reacted with an amine or ammonium hydroxide, which is a basic compound, so that the polymer including the repeating unit of Formula (I) or (III) is formed. The polymer including the repeating unit of Formulas (I) or (III) is water-soluble because the repeating unit of Formulas (I) or (III) forms a salt type in a branched chain of the parts c and h.

The polymer including the repeating unit of Formulas (I) or (III) as a water-soluble negative photoresist polymer is mixed with the photoacid generator in water as a main solvent, thereby forming a photoresist composition. Moreover, when a photolithography process is performed by using the photoresist composition, the acid generated by light in the exposure process reacts with the polymer including the repeating unit of Formulas (I) or (III) in the baking process after the exposure process, and cross-linked or neutralized, so that it is converted into an insoluble material. As a result, the polymer including the repeating unit of Formulas (I) or (III) becomes water-insoluble.

Accordingly, the negative photoresist pattern is formed because the photoresist film of the exposed region is not dissolved in water during the developing process using water, while the photoresist film of the unexposed region is dissolved in water.

Scheme 1 is as shown below:

Scheme 2 is as shown below:

As described above, since the disclosed photoresist polymer is water-soluble, the eco-friendly material, that is, water can be used instead of any conventional organic solvent. Also, the process is simplified and the cost of production is remarkably reduced because the developing process is performed using water and not a basic compound.

In addition, a semiconductor device manufactured using the above-described photoresist composition is also disclosed.

EXAMPLES

The disclosed photoresist polymers and compositions containing the same will be described in detail by referring to examples below, which are not intended to limit the present invention.

I. Preparation of Photoresist Polymer

Example 1

Preparation of poly(acrylic acid/hydroxymethyl acrylate)

To 20 g of tetrahydrofuran (THF) were added 9 g of acrylic acid, 1 g of hydroxymethyl acrylate, and 0.1 g of 2,2'-azobisisobutylronitrile (AIBN). The resulting mixture was reacted at 67° C. for 3 hours. After reaction, the resulting solution was dropped in diethylethyl ether, thereby obtaining 9.2 g of a photoresist polymer of Formula (IVa).

Example 2

Preparation of poly(acrylic acid/hydroxyethyl acrylate)

To 20 g of THF were added 9 g of acrylic acid, 1 g of hydroxyethyl acrylate and 0.1 g of AIBN. The resulting mixture was reacted at 67° C. for 3 hours. After reaction, the resulting solution was dropped in diethylethyl ether, thereby obtaining 9.1 g of a photoresist polymer of Formula (IVb).

Example 3

Preparation of poly(methacrylic acid/hydroxyethyl acrylate)

To 20 g of THF were added 9 g of methacrylic acid, 1 g of hydroxyethyl acrylate and 0.1 g of AIBN. The resulting mixture was reacted at 67° C. for 3 hours. After reaction, the resulting solution was dropped in diethylethyl ether, thereby obtaining 9.0 g of a photoresist polymer of Formula (IVc).

Example 4

Preparation of poly(methacrylic acid/hydroxypropyl methacrylate)

To 20 g of THF were added 9 g of methacrylic acid, 1 g of hydroxypropyl methacrylate, and 0.1 g of AIBN. The resulting mixture was reacted at 67° C. for 3 hours. After reaction, the resulting solution was dropped in diethylethyl ether, thereby obtaining 9.3 g of a photoresist polymer of Formula (IVd).

Example 5

Preparation of poly(acrylic acid/hydroxymethyl acrylate/methyl acrylate)

To 20 g of THF were added 8 g of acrylic acid, 1 g of hydroxymethyl acrylate, 1 g of methyl acrylate, and 0.1 g of AIBN. The resulting mixture was reacted at 67° C. for 3 hours. After reaction, the resulting solution was dropped in diethylethyl ether, thereby obtaining 9.6 g of a photoresist polymer of Formula (Va).

Example 6

Preparation of poly(acrylic acid/hydroxyethyl acrylate/methyl acrylate)

To 20 g of THF were added 8 g of acrylic acid, 1.5 g of hydroxyethyl acrylate, 0.5 g of methyl acrylate, and 0.1 g of AIBN. The resulting mixture was reacted at 67° C. for 3 hours. After reaction, the resulting solution was dropped in diethylethyl ether, thereby obtaining 9.7 g of a photoresist polymer of Formula (Vb).

Example 7

Preparation of poly(acrylic acid/hydroxyethyl acrylate/propyl acrylate)

To 20 g of THF were added 8 g of acrylic acid, 1.5 g of hydroxyethyl acrylate, 0.1 g of propyl acrylate, and 0.1 g of AIBN. The resulting mixture was reacted at 67° C. for 3 hours. After reaction, the resulting solution was dropped in diethylethyl ether, thereby obtaining 9.7 g of a photoresist polymer of Formula (Vc).

Example 8

Preparation of poly(methacrylic acid/hydroxypropyl acrylate/methyl acrylate)

To 20 g of THF were added 8 g of methacrylic acid, 1.5 g of hydroxypropyl acrylate, 0.5 g of methyl acrylate, and 0.1 g of AIBN. The resulting mixture was reacted at 67° C. for 3 hours. After reaction, the resulting solution was dropped in diethylethyl ether, thereby obtaining 9.4 g of a photoresist polymer of Formula (Vd).

II. Preparation of Photoresist Composition and Formation of Pattern Using the Same Example 9

Preparation of Photoresist Composition and Formation of Pattern

To 20 g of water were added 2 g of the photoresist polymer obtained from Example 1, 0.2 g of 20 wt. % teramethylammonium hydroxide (TMAH) aqueous solution, and 0.01 g of phthalimidotrifluoromethane sulfonate and 0.03 g of triphenylsulfonium triflate, which are photoacid generators. The resulting mixture was filtered with a 0.20 μm filter, thereby obtaining a disclosed photoresist composition.

Figure 1:
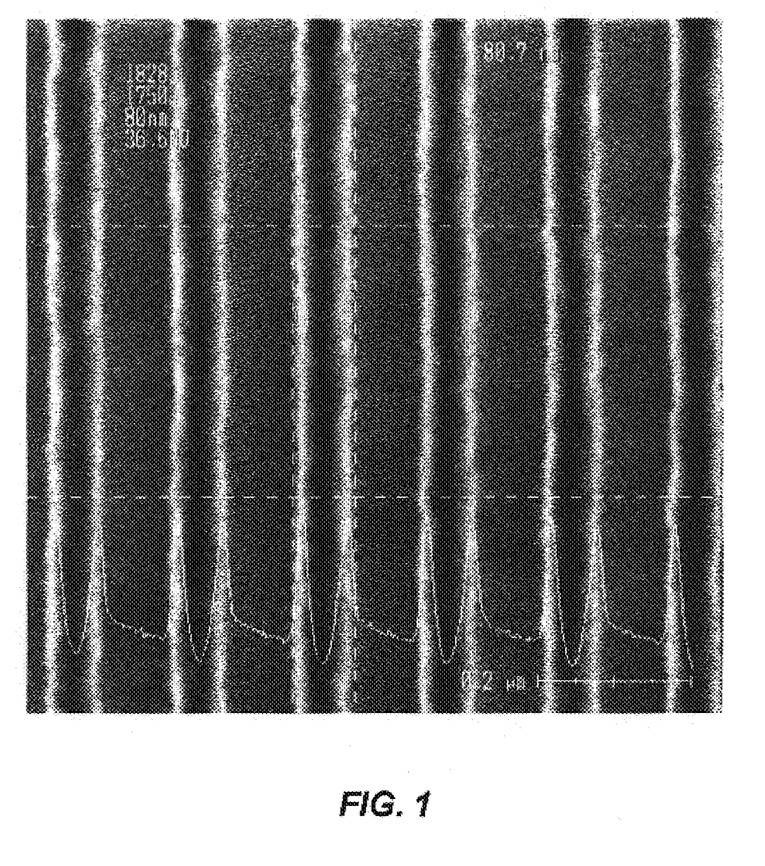
FIG. 1 is a photograph showing a photoresist pattern obtained in Example 9.

The photoresist composition was spin-coated on a silicon wafer, and soft-baked at 130° C. for 90 seconds. After soft-baking, the photoresist film was exposed to light using an ArF laser exposer, and then post-baked at 130° C. for 90 seconds. After post-baking, the wafer was developed in water for 60 seconds to obtain the 0.08 m L1/S pattern, shown in FIG. 1.

Example 10

Preparation of Photoresist Composition and Formation of Pattern (2)

Figure 2:
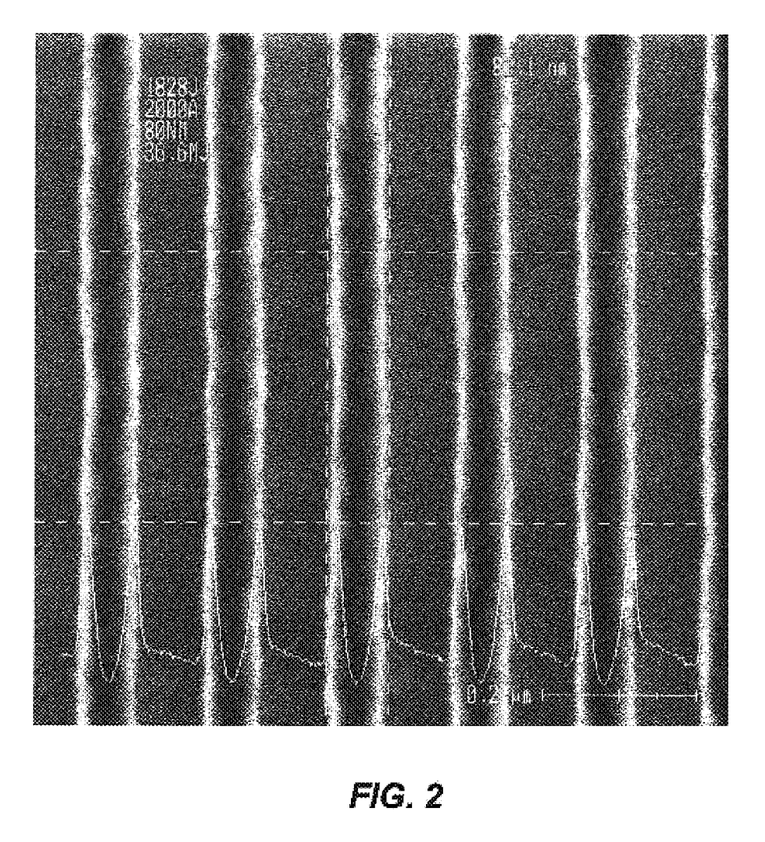
FIG. 2 is a photograph showing a photoresist pattern obtained in Example 10.

The procedure of Example 9 was repeated using the photoresist polymer of Example 2 (instead of the polymer of Example 1) to obtain the 0.08 μm L/S pattern, shown in FIG. 2.

Example 11

Preparation of Photoresist Composition and Formation of Pattern (3)

Figure 3:
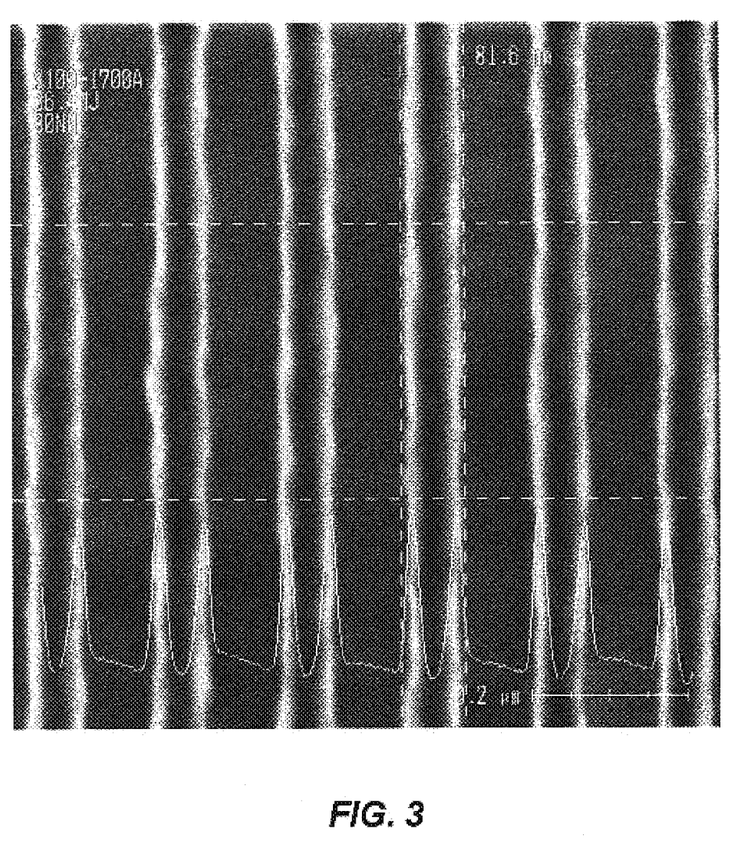
FIG. 3 is a photograph showing a photoresist pattern obtained in Example 11.

The procedure of Example 9 was repeated using the photoresist polymer of Example 3 (instead of the polymer of Example 1) to obtain the 0.08 μm L/S pattern, shown in FIG. 3.

Example 12

Preparation of Photoresist Composition and Formation of Pattern (4)

Figure 4:
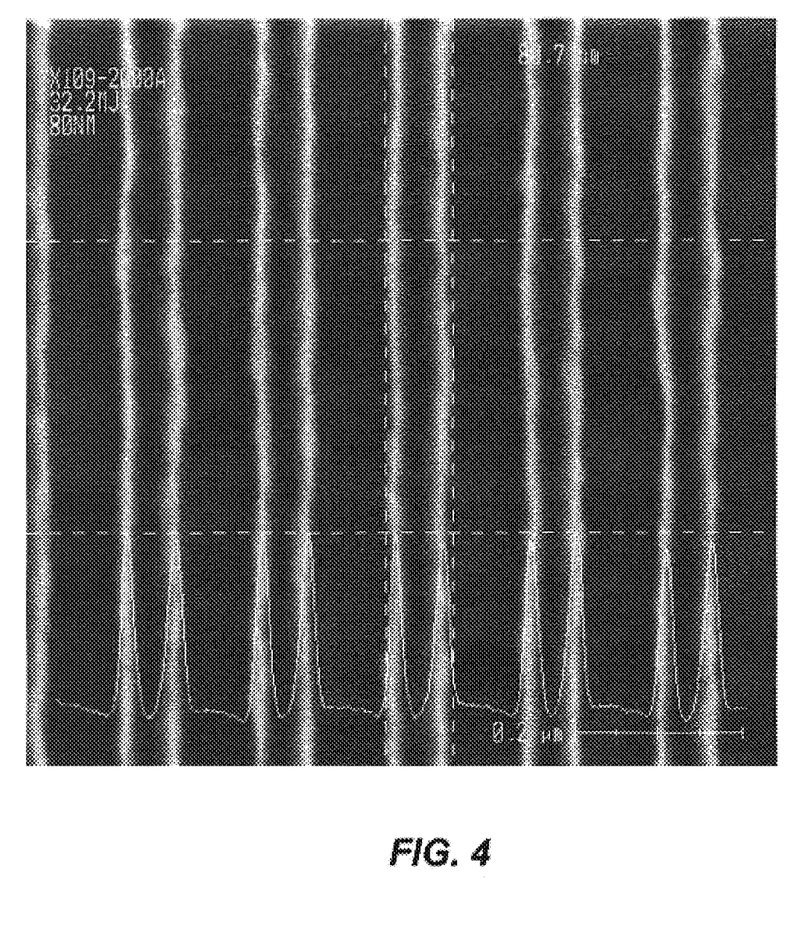
FIG. 4 is a photograph showing a photoresist pattern obtained in Example 12.

The procedure of Example 9 was repeated using the photoresist polymer of Example 4 (instead of the polymer of Example 1) to obtain the 0.08 μm L/S pattern, shown in FIG. 4.

Example 13

Preparation of Photoresist Composition and Formation of Pattern (5)

Figure 5:
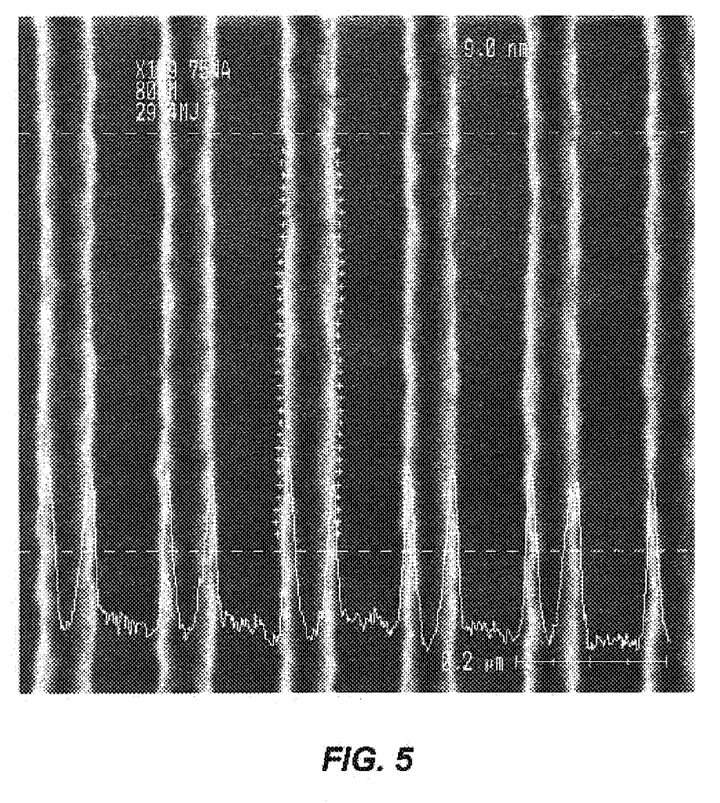
FIG. 5 is a photograph showing a photoresist pattern obtained in Example 13.

The procedure of Example 9 was repeated using the photoresist polymer of Example 5 (instead of the polymer of Example 1) to obtain the 0.08 μm L/S pattern, shown in FIG. 5.

Example 14

Preparation of Photoresist Composition and Formation of Pattern (6)

Figure 6:
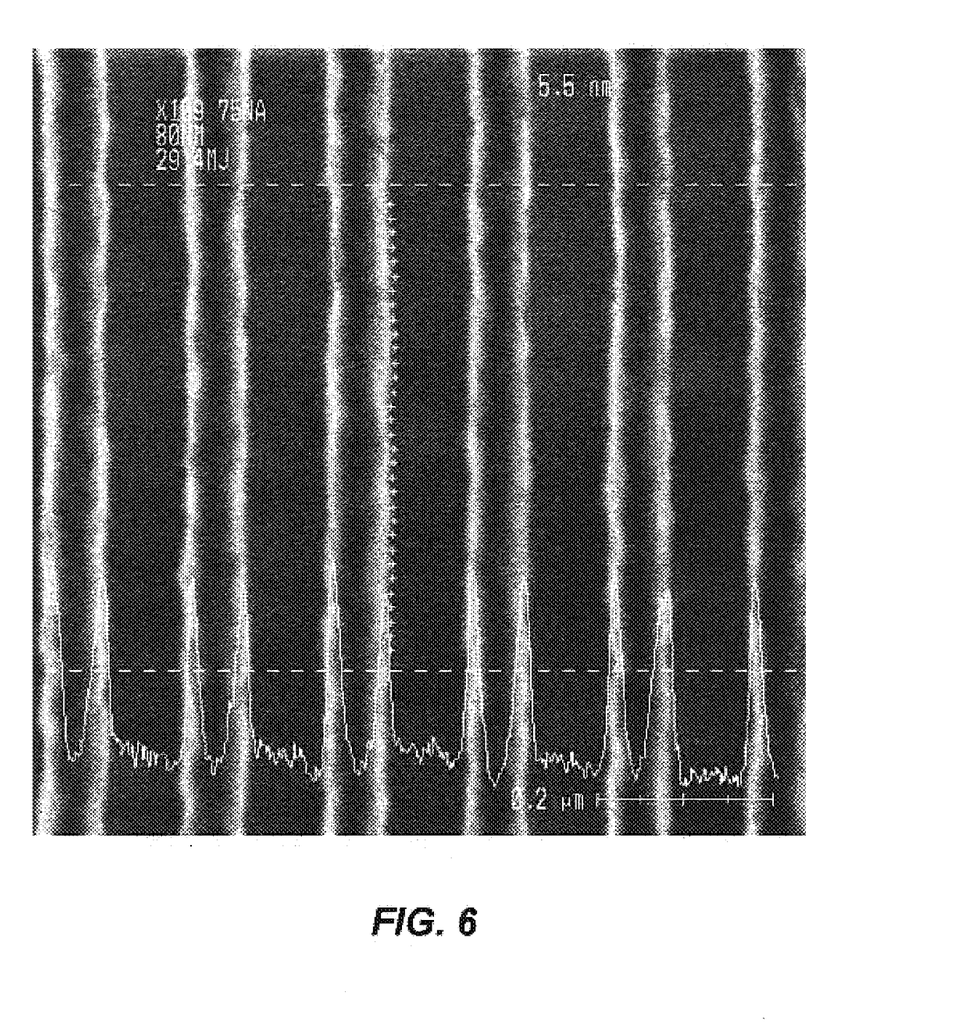
FIG. 6 is a photograph showing a photoresist pattern obtained in Example 14.

The procedure of Example 9 was repeated using the photoresist polymer of Example 6 (instead of the polymer of Example 1) to obtain the 0.08 μm L/S pattern, shown in FIG. 6.

Example 15

Preparation of Photoresist Composition and Formation of Pattern (7)

Figure 7:
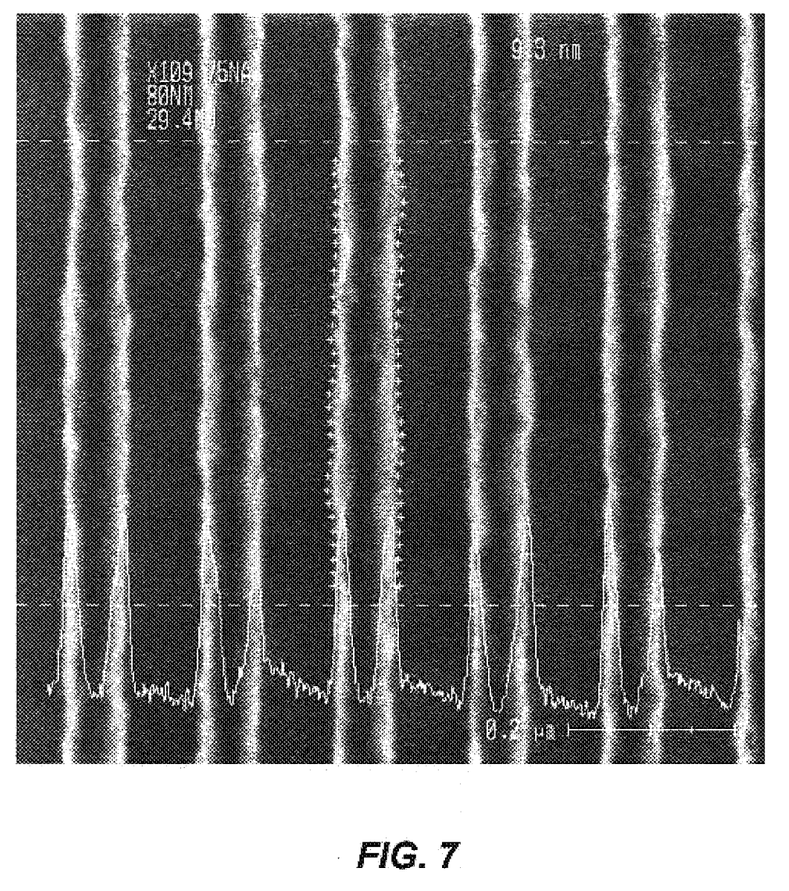
FIG. 7 is a photograph showing a photoresist pattern obtained in Example 15; and, FIG. 8 is a photograph showing a photoresist pattern obtained in Example 16.

The procedure of Example 9 was repeated using the photoresist polymer of Example 7 (instead of the polymer of Example 1) to obtain the 0.08 μm L/S pattern, shown in FIG. 7.

Example 16

Preparation of Photoresist Composition and Formation of Pattern (8)

Figure 8:
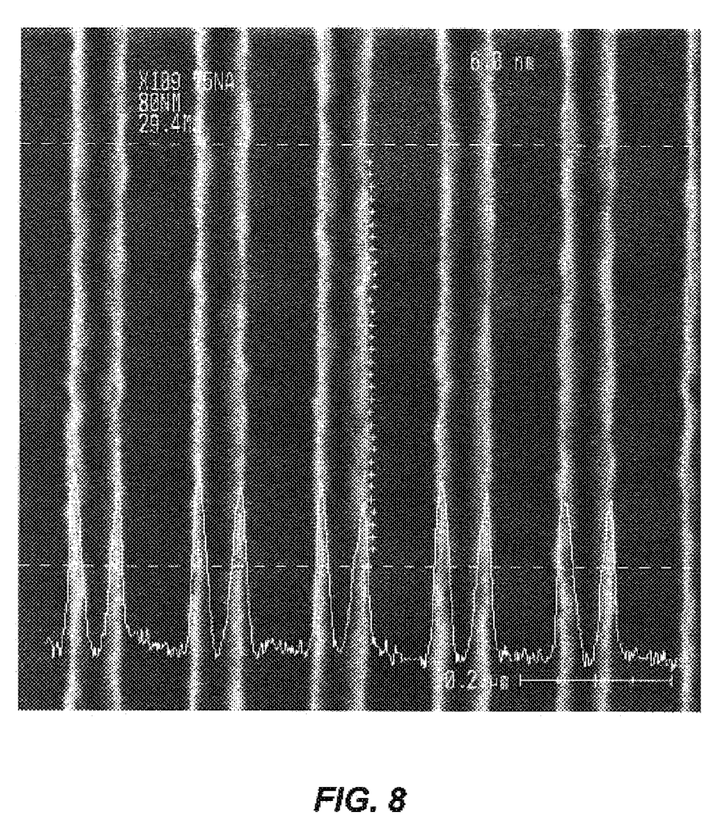

The procedure of Example 9 was repeated using the photoresist polymer of Example 8 (instead of the polymer of Example 1) to obtain the 0.08 μm L/S pattern, shown in FIG. 8.

As discussed above, photoresist patterns can be formed by using the disclosed photoresist composition. The composition includes a negative photoresist polymer having a salt-type repeating unit, water, and a photoacid generator so that a developing process can be performed by using water, instead of a conventional TMAH solution. Additionally, because the main solvent of the composition is water, the disclosed photoresist composition is eco-friendly, and has a low light absorbance at 193 nm and 248 mm, which is useful in a photolithography process using a light source in a far ultraviolet region when high-integrated fine circuits of semiconductor device are manufactured.

What is claimed is:

1. A photoresist composition comprising a basic compound, water, and a photoacid generator, and a polymer having a repeating unit represented by Formula (IV):

(IV)

wherein R1 and R2 are individually selected from the group consisting of hydrogen, C1-C10 alkyl, and CF3; the relative ratio of a:b is 1 to 99 mol. %:1 to 99 mol. %; and, m is an integer ranging from 1 to 10.

2. The photoresist composition of claim 1, wherein the repeating unit of Formula (IV) is selected from the group consisting of Formulas (IVa) to (IVd):

(IVa)

(IVb)

(IVc)

(IVd)

wherein the relative ratio of a:b is 1 to 99 mol. %:1 to 99 mol. %.

3. The photoresist composition of claim 1, further comprising a $C_1$-$C_{10}$ alcohol.

4. The photoresist composition of claim 3, wherein the $C_1$-$C_{10}$ alcohol is selected from the group consisting of 2-propanol, butyl alcohol, 2-methyl-2-butanol, 2-pentanol, 3-pentanol, 1-hexanol, 1-heptanol, and mixtures thereof.

5. The photoresist composition of claim 3, wherein the $C_1$-$C_{10}$ alcohol is present in an amount ranging from 1 wt. % to 50 wt. %, based on the weight of water present in the composition.

6. The photoresist composition of claim 1, wherein the photoresist polymer is present in an amount ranging from 2 wt. % to 30 wt. %, based on the weight of water present in the composition.

7. The photoresist composition of claim 1, wherein the basic compound is an amine or ammonium hydroxide.

8. The photoresist composition of claim 1, wherein the basic compound is present in an amount ranging from 0.001 wt. % to 0.1 wt. %, based on the weight of water present in the composition.

9. The photoresist composition of claim 1, wherein the photoacid generator is one or more compounds selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, and naphthylimido trifluoromethane sulfonate.

10. The photoresist composition of claim 1, wherein the photoacid generator is present in an amount ranging from 0,5 wt. % to 10 wt. %, based on the weight of photoresist polymer present in the composition.

11. The photoresist composition of claim 1, wherein the polymer of Formula (IV) is reacted with the basic compound to form a polymer of Formula (I);

wherein $R_1$, $R_2$, $R_3$, $R_4$, $R_5$, and $R_6$ are individually selected from the group consisting of hydrogen, $C_1$-$C_{10}$ alkyl, and $CF_3$;

the relative ratio of b:c d is 0.5 to 99.5 mol. % 0.5 to 95 mol. % 0 to 99 mol. %; the relative ratio of a:b is 1 to 99 mol. %:1 to 99 mol. %; and m is an integer ranging from 1 to 10.

12. A photoresist composition comprising a basic compound, water, a photoacid generator, and a polymer having a repeating unit represented by Formula (V):

wherein $R_7$, $R_8$, $R_9$ and $R_{10}$ are individually selected from the group consisting of hydrogen, $C_1$-$C_{10}$ alkyl, and $CF_3$;

the relative ratio of e:f:g is 0.5 to 99.9 mol. % 0 to 50 mol. % 0.1 to 30 mol. %; and, n is an integer ranging from 1 to 10.

13. The photoresist composition of claim 12, wherein the repeating unit of Formula (V) is selected from the group consisting of Formulas (Va) to (Vd):

wherein the relative ratio of e:f:g is 0.5 to 99.9 mol. % 0 to 50 mol. % 0.1 to 30 mol. %.

14. The photoresist composition of claim 12, further comprising a $C_1$-$_{10}$ alcohol.

15. The photoresist composition of claim 14, wherein the $C_1$-$C_{10}$ alcohol is selected from the group consisting of 2-propanol, butyl alcohol, 2-methyl-2-butanol, 2-pentanol, 3-pentanol, 1-hexanol, 1-heptanol, and mixtures thereof.

16. The photoresist composition of claim 14, wherein the $C_1$-$C_{10}$ alcohol is present in an amount ranging from 1 wt. % to 50 wt. %, based on the weight of water present in the composition.

17. The photoresist composition of claim 12, wherein the photoresist polymer is present in an amount ranging from 2 wt. % to 30 wt. %, based on the weight of water present in the composition.

18. The photoresist composition of claim 12, wherein the basic compound is an amine or ammonium hydroxide.

19. The photoresist composition of claim 12, wherein the basic compound is present in an amount ranging from 0.001 wt. % to 0.1 wt. %, based on the weight of water present in the composition.

20. The photoresist composition of claim 12, wherein the photoacid generator is one or more compounds selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, and naphthylimido trifluoromethane sulfonate.

21. The photoresist composition of claim 12, wherein the photoacid generator is present in an amount ranging from 0.5 wt. % to 10 wt. %, based on the weight of photoresist polymer present in the composition.

22. The photoresist composition of claim 12, wherein the polymer of Formula (V) is reacted with the basic compound to form a polymer of Formula (III);

(III)

(V)

wherein $R_7$, $R_8$, $R_9$, $R_{10}$, $R_{11}$, $R_{12}$, $R_{13}$, and $R_{14}$ are individually selected from the group consisting of hydrogen, $C_1$-$C_{10}$ alkyl, and $CF_3$;

the relative ratio of f:g:h:i is 0 to 50 mol. % 0.1 to 30 mol. %:1 to 98.9 mol. %:1 to 98.9 mol. %; the relative ratio of e:f:g is 0.5 to 99.9 mol. %:0 to 50 mol. %:0.1 to 30 mol. %, and n is an integer ranging from 1 to 10.

23. A method of forming a photoresist pattern, the method comprising:
  (a) coating the photoresist composition of claim 1 on an underlying layer of a semiconductor substrate to form a photoresist film;
  (b) exposing the photoresist film to light; and,
  (c) developing the exposed photoresist film to obtain a photoresist pattern.

24. The method of claim 23, further comprising baking the photoresist film either before or after the exposing step (b).

25. The method of claim 24, wherein the baking is performed at a temperature ranging from 70° C. to 200° C.

26. The method of claim 23, wherein the light is selected from the group consisting of $F_2$ (157 nm), ArF (193 nm), KrF (248 nm), E-beam, EUV (13 nm), and ion beam.

27. The method of claim 23, wherein the exposing step (b) is performed at an exposure energy ranging from 0.1 mJ/cm$^2$ to 100 mJ/cm$^2$.

28. A method of forming a photoresist pattern, the method comprising:
  (a) coating the photoresist composition of claim 12 on an underlying layer of a semiconductor substrate to form a photoresist film;
  (b) exposing the photoresist film to light; and,
  (c) developing the exposed photoresist film to obtain a photoresist pattern.

29. The method of claim 28, further comprising baking the photoresist film either before or after the exposing step (b).

30. The method of claim 29, wherein the baking is performed at a temperature ranging from 70° C. to 200° C.

31. The method of claim 28, wherein the light is selected from the group consisting of $F_2$ (157 nm), ArF (193 nm), KrF (248 nm), E-beam, EUV (13 nm), and ion beam.

32. The method of claim 28, wherein the exposing step (b) is performed at an exposure energy ranging from 0.1 mJ/cm$^2$ to 100 mJ/cm$^2$.

* * * * *